(12) United States Patent
Kim et al.

(10) Patent No.: US 8,519,542 B2
(45) Date of Patent: Aug. 27, 2013

(54) AIR THROUGH-SILICON VIA STRUCTURE

(75) Inventors: Namhoon Kim, Mt. View, CA (US); Dong W. Kim, San Jose, CA (US); Paul Y. Wu, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 173 days.

(21) Appl. No.: 12/849,181

(22) Filed: Aug. 3, 2010

(65) Prior Publication Data

US 2012/0032326 A1 Feb. 9, 2012

(51) Int. Cl.
*H01L 23/52* (2006.01)

(52) U.S. Cl.
USPC ............. 257/774; 257/684; 257/E23.008; 257/E23.011

(58) Field of Classification Search
USPC .......... 257/684, 698, 734, 773, 774, E23.008, 257/E23.011
See application file for complete search history.

(56) References Cited

U.S. PATENT DOCUMENTS

| | | | |
|---|---|---|---|
| 6,278,181 B1 | 8/2001 | Maley | |
| 6,856,023 B2 * | 2/2005 | Muta et al. | 257/774 |
| 2003/0030245 A1 * | 2/2003 | Janssen | 280/259 |
| 2004/0097065 A1 * | 5/2004 | Lur et al. | 438/619 |
| 2006/0055032 A1 * | 3/2006 | Chang et al. | 257/734 |
| 2007/0076339 A1 * | 4/2007 | Lur et al. | 361/56 |
| 2007/0290316 A1 * | 12/2007 | Gibson et al. | 257/686 |
| 2008/0272498 A1 | 11/2008 | Yu et al. | |
| 2008/0284037 A1 | 11/2008 | Andry et al. | |
| 2009/0057912 A1 * | 3/2009 | Kheng | 257/774 |
| 2010/0032808 A1 | 2/2010 | Ding et al. | |
| 2010/0176494 A1 | 7/2010 | Chen | |
| 2010/0225005 A1 | 9/2010 | Nishio et al. | |
| 2011/0291288 A1 * | 12/2011 | Wu et al. | 257/774 |
| 2012/0018893 A1 * | 1/2012 | Oganesian et al. | 257/773 |
| 2012/0091587 A1 * | 4/2012 | Or-Bach et al. | 257/741 |
| 2012/0290996 A1 * | 11/2012 | Law et al. | 716/127 |
| 2012/0295433 A1 * | 11/2012 | Su et al. | 438/585 |

FOREIGN PATENT DOCUMENTS

WO    WO 2010/023812 A1    3/2010

\* cited by examiner

*Primary Examiner* — Eduardo A Rodela (74) *Attorney, Agent, or Firm* — Scott Hewett; Gerald Chan (57) ABSTRACT

A silicon substrate has a conductive via extending from a first surface of the silicon substrate through the silicon substrate to a second surface of the silicon substrate. A dielectric via extends from the second surface of the silicon substrate toward the first surface of the silicon substrate.

13 Claims, 5 Drawing Sheets

AIR THROUGH-SILICON VIA STRUCTURE

FIELD OF THE INVENTION

An embodiment of the invention relates generally to integrated circuits, and more particularly to techniques for fabricating through-silicon vias with low capacitance and crosstalk.

BACKGROUND

For a given node technology, increasing integrated circuit (IC) size typically increases the functionality that can be included on a die. Unfortunately, defects often scale with die area. A large die is more likely to incorporate a defect than is a smaller die. Defects affect yield, and yield loss often increases with increasing die size. Various techniques have been developed to provide large ICs at desirable yield levels.

One approach to providing large ICs is to construct a large IC out of multiple smaller IC dice on a silicon interposer using through-silicon via (TSV) techniques. A silicon interposer is essentially a substrate to which the dice are flip-chip bonded after the silicon interposer has been processed to provide metal wiring and contacts. A silicon interposer typically has several patterned metal layers and intervening insulating layers connected to TSVs. Multiple IC dice are physically and electrically connected to the interposer with micro-bump arrays.

Many TSVs carry low-frequency signals or DC, such as a bias voltage or a ground return, and conventional TSVs are adequate for these applications. However, ICs that have radio-frequency (RF) or other high-frequency ports (e.g., pins or pads), or critical digital paths, such as a digital path with fast (e.g., 200 ps or less) rise or fall time, the high-frequency performance of a conventional TSV may be the limiting factor in the high-frequency or critical data path. For example, a high capacitance TSV may degrade a high-frequency signal, degrade rise/fall times of a digital signal, increase crosstalk between a signal on another TSV, or increase noise injection.

Shielding techniques are often used to reduce crosstalk between signal wires. For example, a conductive ground plane surrounding one wire shields that wire from unwanted crosstalk from other signal wires or from noise. Unfortunately, some shielding techniques for TSVs increase TSV capacitance. While such increased capacitance is acceptable in some TSV applications, it is undesirable in others.

Techniques for reducing TSV capacitance and crosstalk between TSVs are desirable.

SUMMARY

A device according to an embodiment has a silicon substrate with a conductive via extending from a first surface of the silicon substrate through the silicon substrate to a second surface of the silicon substrate. A dielectric via extends from the second surface of the silicon substrate toward the first surface of the silicon substrate. In some embodiments, the dielectric via extends from the second surface of the silicon substrate through the silicon substrate to the first surface of the silicon substrate. In other embodiments, the dielectric via does not extend all the way through the silicon. In some embodiments, the dielectric via is an air via, that is, the via is not filled with a solid dielectric material and air provides the dielectric.

In a further embodiment, a plurality of patterned metal layers and intervening dielectric layers are fabricated on the first surface of the silicon substrate. In a particular embodiment, the plurality of patterned metal layers includes a patterned metal layer defining a contact array, and the device includes an integrated circuit (e.g., a field programmable gate array) flip-chip bonded to the contact array. In a further embodiment, a second IC is flip-chip bonded to a second contact array.

In another embodiment, the silicon substrate comprises an integrated circuit substrate.

In one embodiment, the conductive via includes a conductive element having a first diameter and the dielectric via has a second diameter, the second diameter being greater than the first diameter. In an alternative embodiment, the conductive via includes a conductive element having a first diameter and the dielectric via has a second diameter, the second diameter being less than the first diameter. In another embodiment, the diameters of the conductive via and dielectric via are essentially the same. In yet other embodiments, the substrate has dielectric vias of different design diameters (i.e., the different diameters are intentional, and not an artifact of the manufacturing tolerances). In a further embodiment, the device includes a second conductive via, and the dielectric via is disposed between the first conductive via and the second conductive via. A yet further embodiment includes a second dielectric via disposed between the first dielectric via and the second conductive via. Further embodiments include additional dielectric vias disposed between the conductive vias.

In a particular embodiment, the dielectric via is proximate to the conductive via and second, third, and fourth dielectric vias are also proximate to the conductive via. Fifth, sixth, seventh, and eighth dielectric vias are diagonally proximate to the conductive via. In another embodiment, the dielectric via is proximate to the conductive via at a distance from the conductive via, and second, third, and fourth dielectric vias are also disposed at the distance, e.g., arrayed around the conductive via in a cross or grid pattern. A solder ball is connected to the conductive via at the second surface of the silicon substrate in some embodiments.

In another embodiment, an interposer is fabricated by etching first via holes in a silicon interposer wafer from a first surface of the silicon interposer wafer. A dielectric liner layer is formed on sidewalls of the first via holes, such as by growing silicon dioxide on the sidewalls in a thermal oxidation process. Conductor elements are formed in the first via holes, and a stack of patterned metal layers and inter-metal dielectric layers is formed on the first surface of the silicon interposer wafer. Material is removed from a second surface of the silicon interposer wafer to expose the ends of the conductor elements. Second via holes are etched in the silicon wafer from the second surface of the silicon interposer wafer toward the first surface. The second via holes are optionally filed with a dielectric solid, which can be applied in a liquid state and then transformed to a solid state.

In some embodiments, the second via holes are etched through the silicon substrate to create thorough-silicon dielectric vias. In other embodiments, the etching of the second via holes is stopped before reaching the stack of patterned metal layers. In a particular embodiment, etching the second via holes includes etching a second via hole between a first conductor element and a second conductor element.

DETAILED DESCRIPTION

Figure 1:
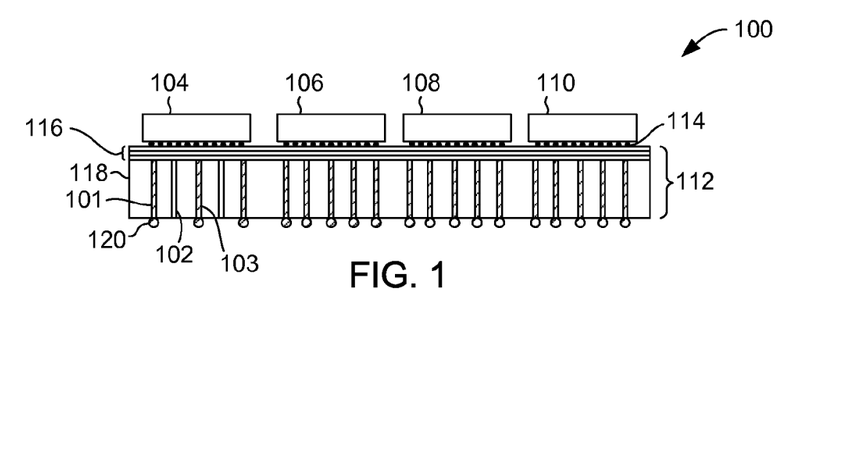
FIG. 1 is a cross section of a composite IC with dielectric TSVs in an interposer according to an embodiment.

FIG. 1 is a cross section of a composite IC 100 with a dielectric TSV 102 between conductive TSVs 101, 103 in an interposer 112, according to an embodiment. Four IC dice 104, 106, 108, 110 are mounted on the interposer 112. The IC dice 104, 106, 108, 110 are flip-chip bonded to the interposer 112, making electrical connection to the conductive TSVs 101, 103 of the interposer 112 through conductive microbump arrays 114. For example, the IC dice can be fabricated with a C4 or microbump array, which electrically and mechanically connects each IC die to corresponding micro-contact arrays on the interposer. Other types of contacts, contact arrays, and bonding techniques can be alternatively used. Other features and structures, such as underfill or molding compound, are omitted for purposes of illustration.

The dielectric TSVs 102 are not conductive. The dielectric TSVs are filled with a dielectric, such as with air or a solid or gel dielectric material. The dielectric TSV 102 reduces the capacitance of the conductive TSVs 101, 103 and reduces the crosstalk between the conductive TSVs 101, 103 by reducing the dielectric constant of the ambient near the conductive TSVs. For example, the silicon material of the interposer has a relative dielectric constant of about 11.9, while air has a relative dielectric constant of about 1. If the dielectric TSV 102 is essentially an unfilled hole through the silicon wafer portion 118 of the interposer, the conductive TSV 101 has a reduced capacitance, because a portion of what otherwise would be silicon has been replaced with air. Furthermore, many silicon substrates used for interposers are at least slightly electrically conductive, which further increases TSV capacitance, whereas the air in the dielectric TSV 102 is not electrically conductive.

The dielectric TSV 102 also reduces coupling (crosstalk) between the conductive TSVs 101, 103 by replacing the silicon with dielectric that has higher resistivity or a lower dielectric constant than the silicon. This is especially true with air, which has both very low dielectric constant and very high resistivity. The interposer 112 has additional dielectric TSVs surrounding the conductive TSVs or disposed between the conductive TSVs (see, e.g., FIG. 2). In other embodiments, the dielectric TSVs are filled with dielectric solid or gel having a lower dielectric constant or higher resistivity than the silicon of the substrate.

The interposer 112 has patterned metal layers 116 fabricated on the silicon wafer portion 118. In a particular example, the silicon wafer portion 118 is a portion of a silicon wafer similar to those used in IC fabrication and the interposer is an active interposer (i.e., the interposer includes electronic devices in addition to patterned metal layers). The patterned metal layers 116 may be formed using deposition and photolithographic techniques similar to those used for IC fabrication. For example, if an IC fabrication process flow (e.g., a 90 nm node technology) defines several patterned metal layers on an IC wafer (commonly called the back-end-of-line (BEOL) fabrication process), processes similar to those used to define the upper metal layers of the IC may be used to fabricate the patterned metal layers on the interposer wafer. Interposers typically have 1 to 4 patterned metal layers separated by intervening dielectric layers and interconnected using conductive vias, as is well known in the art of thin film, damascene, or dual damascene processing. However, these numbers are merely exemplary.

An interposer according to some embodiments is a passive interposer. That means that the interposer does not have electronic devices, such as diodes, thin-film capacitors, and transistors, fabricated in the silicon of the interposer. Alternative embodiments incorporate active interposers, which have transistors or other devices fabricated in the silicon of the interposer. Such electronic devices are fabricated in what is commonly called front-end-of-line (FEOL) processing. In some embodiments, the active interposer incorporates a mid- to high-level of integrated circuitry. In other embodiments, relatively few electronic components are fabricated in the silicon of the interposer to handle functions such as voltage control, power distribution, and basic switching.

The interposer 112 translates the fine-pitch of the IC contacts on the topside of the interposer to a less-fine pitch on the backside. In particular examples, the topside of the interposer has about 20,000 to about 60,000 microbump contacts, and about 10,000 to about 30,000 TSVs, depending on the size of the composite IC, the number and type of ICs mounted on the interposer, and other factors. In a particular example, the microbumps are at a 45 micron pitch, and the TSVs are bumped 120 to form a bump array having a pitch of about 180 microns to about 200 microns.

In an exemplary fabrication sequence, the dielectric TSVs in the interposer are formed after the conductive TSVs and patterned metal layers have been formed. This is commonly known as a "via-last" process, whereas the conductive TSVs have been formed by what is commonly known as a "via-first" process. While conductive vias can be produced using via-last techniques, alignment of the etch mask to pre-existing patterned metal layers on the opposite of the wafer can be challenging, and can result in undesirable low manufacturing yields. The dielectric TSVs are not electrically connected to contacts in the overlying patterned metal layer, and do not need to be held to the same manufacturing tolerances that might arise for conductive vias made by a via-last process. Also, the conductive vias made using a via-first process provide alignment references for the dielectric vias made using a via-last process. Basically, the dielectric TSVs are defined on the side of the interposer opposite the IC die interface using photolithographic techniques and are etched from that side.

Those of skill in the art of composite ICs appreciate that FIG. 1 is simplified for purposes of illustration, and specific dimensions and numbers are merely exemplary. In a particular embodiment, pin 103 of IC 104 is a high-frequency signal pin, for example, pin 103 is intended to carry signals of at least 6 Gbps. It is particularly desirable to use dielectric TSVs in combination with conductive TSVs intended to carry high-frequency signals, because reducing capacitance and crosstalk on high-frequency signal paths provides improved performance. Other conductive TSVs, such as TSVs intended to be connected to a bias voltage, ground, or low-frequency signal, may optionally be used in combination with dielectric TSVs according to one or more embodiments. However, interposers according to some embodiments include conductive TSVs used in combination with dielectric TSVs and conductive TSVs used without adjacent dielectric TSVs.

Figure 2:
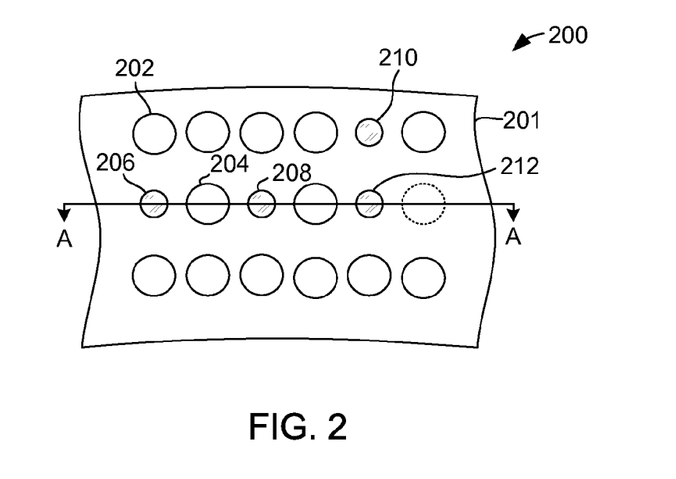
FIG. 2 is a plan view of a portion of an interposer with dielectric TSVs according to an embodiment.

FIG. 2 is a plan view of a portion of an interposer 200 with dielectric TSVs 202, 204 formed in the silicon substrate 201 of the interposer 200 according to an embodiment. The view is a top view of the interposer with overlying patterned metal layers removed (compare, FIG. 3, ref. num. 302). The overlying features are not shown, in order to illustrate the relationship between dielectric and conductive TSVs in the silicon substrate 201.

The dielectric TSV 204 is between a first conductive TSV 206 and a second conductive TSV 208. The dielectric TSV 204 reduces the capacitance of both conductive TSVs 206, 208, and reduces crosstalk between conductive TSV 206 and conductive TSV 208.

The TSVs extend from one major surface (e.g., top surface) of the silicon substrate to the opposite major surface (e.g., bottom surface) of the silicon substrate. The dielectric TSVs are left unfilled (i.e., air TSVs) or are filled with one or more dielectric materials, and are generally non-conductive. The conductive TSVs provide a conductive path from one major surface of the silicon substrate to the opposite major surface of the silicon substrate. In conventional conductive TSVs, a dielectric liner layer (e.g., silicon dioxide) is grown on the inner wall of the through-silicon hole, then a seed layer of metal is sputtered onto the liner layer and metal, such as copper, is plated to provide the conductive path through the conductive TSV. Other metal systems are alternatively used, and the conductor can be a solid or hollow cylinder, for example. The bottom side (i.e., the side opposite the side on which the ICs are mounted) typically includes a contact array (not shown, see FIG. 3, ref. num. 304), such as a ball grid array, for mounting to a printed wiring board or packaging substrate.

The dielectric and conductive TSVs are arranged in a grid pattern; however, this arrangement is merely exemplary. Alternative embodiments offset dielectric TSVs from rows or columns of the conductive TSV array, for example. While conductive TSV 208 is essentially surrounded by eight dielectric TSVs, other conductive TSVs 210, 212 are not. While the dielectric TSVs are shown as being essentially round, alternative embodiments use other shapes, such as rectangular or oval shapes. Similarly, the dielectric TSVs in FIG. 2 are shown as being larger than the conductive TSVs, but alternative embodiments include dielectric TSVs that are smaller than the conductive TSVs (see, e.g., FIG. 4), or that are the same size as conductive TSVs, or combine dielectric or conductive TSVs of various sizes and/or shapes.

Figure 3:
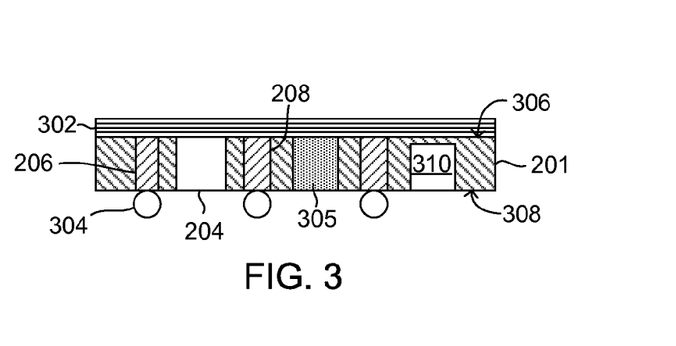
FIG. 3 is a cross section of the interposer of FIG. 2 with backend patterned metal layers.

FIG. 3 is a cross section of the interposer of FIG. 2 taken along section line A-A, with patterned metal layers 302 formed on the silicon substrate 201. The patterned metal layers 302 are commonly referred to as a backend stack, which is formed on the top side (first side) 306 of the silicon substrate 201. In a particular embodiment, the backend stack includes damascene or dual-damascene patterned metal layers interconnected through inter-metal layers of dielectric material, as is well known in the art of semiconductor fabrication. The patterned metal layers translate the conductive TSV pattern to the appropriate IC contact array pattern(s), and optionally consolidate or distribute pins on the IC(s) to conductive TSVs. Contacts 304, such as a ball grid array or bump array, are formed on the back side (second side) 308 of the interposer. The contacts 304 interface with a printed wiring board or package substrate, for example. The dielectric TSV 204 between conductive TSV 206 and conductive TSV 208 reduces the capacitance of both conductive TSVs and reduces crosstalk between the conductive TSVs 206, 208.

Conductive and dielectric TSVs can be fabricated according to a variety of techniques. In some embodiments, a via-first process is used for both the conductive and dielectric TSVs, with the conductive TSVs being filled with a conductor, as with conventional TSVs, and the dielectric TSVs being filled with a solid or gel dielectric material or left unfilled (i.e., air TSVs) before or after the conductive TSVs are filled. The via holes are typically etched into the silicon substrate, but not all the way through the substrate. Then, the via holes are filled according to which type of TSV is desired, typically using an intermediate masking process, or, alternatively, using a two-step etch process (one etch to define the conductive TSV holes, which are then filled with a conductor, and a subsequent etch to define the dielectric TSV holes). Top side TSV holes are typically not etched through the wafer, but are blind holes. After the TSV holes are filled, the wafer is planarized and the top side layers (patterned metal layer stack 302) are fabricated, and the wafer is backlapped to expose the TSVs etched from the top side.

In an alternative process, the conductive TSVs are formed using a via-first technique, and then the dielectric TSVs are formed using a via-last technique. Basically, after the conductive vias have been exposed by backlapping the wafer, a second silicon etch sequence is performed that forms the dielectric TSV holes. While via-last processes are difficult to align for conductive TSVs, alignment tolerances are less stringent for dielectric TSVs. The dielectric TSVs formed by the via-last process may be filled with a dielectric material 305 such as silicon oxide, organic dielectric material, or aerogel, or left unfilled (i.e., an air TSV). A filled dielectric TSV is shown in FIG. 3 for purposes of illustration. Although a single interposer or other substrate may incorporate various embodiments, such as filled and air TSVs, other embodiments incorporate substantially identical dielectric TSVs, such as air TSVs.

In some embodiments, a dielectric via 310 does not extend all the way through the silicon substrate from the first side 306 to the second side 308 of the silicon substrate 201. These dielectric vias are commonly referred to as TSVs for purposes of convenient discussion, even though they are essentially blind holes and do not extend all the way through the silicon. As explained above, although a single interposer or other substrate may incorporate various embodiments, such as through and blind TSVs, other embodiments incorporate substantially identical TSVs, such as all through TSVs or all blind TSVs.

Figure 4:
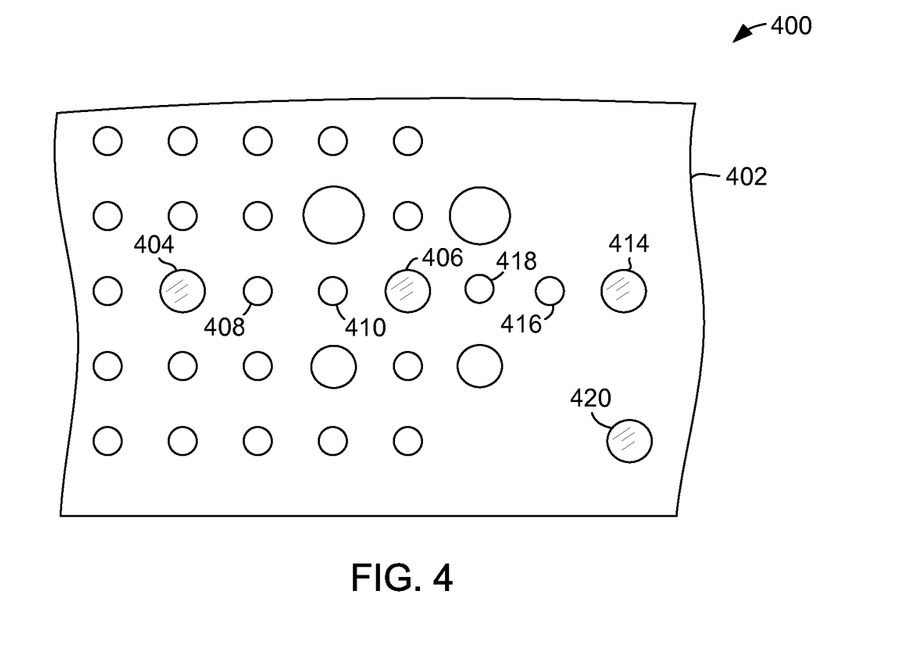
FIG. 4 is a plan view of a portion of an interposer according to another embodiment.

FIG. 4 is a plan view of a portion of an interposer 400 according to another embodiment. As in FIG. 2, above, the patterned metal layers are not shown so as to illustrate the relationships of the conductive and dielectric TSVs in the silicon wafer 402. The conductive TSVs 404, 406 are larger in diameter than the dielectric TSVs 408, 410. In an alternative embodiment, the silicon substrate is an integrated circuit substrate, such as an FPGA substrate, and the conductive and dielectric TSVs extend from the backside of the integrated circuit substrate, the conductive TSVs typically being electrically connect to the integrated circuit.

The diameter(s) and shape(s) of dielectric TSVs varies according to manufacturing process and interposer design. It is desirable to replace silicon near a conductive TSV with air or other dielectric. In some embodiments, reducing the diameter of dielectric TSVs results in a greater reduction of silicon near the conductive TSV(s) (basically by tighter packing of the dielectric TSVs), which improves electrical performance of the conductive TSV(s), since several smaller dielectric TSVs may be used to remove a greater portion of silicon.

Two dielectric TSVs 408, 410 are between conductive TSVs 404, 406. The dielectric TSVs 408, 410 reduce the capacitance of each conductive TSV 404, 406 and reduce crosstalk between the conductive TSVs 404, 406. Dielectric TSVs are not required around or in close proximity to each conductive TSV in the interposer. For example, while conductive TSV 406 is surrounded by dielectric TSVs, conductive TSV 414 has some dielectric TSVs 416, 418 in close proximity as a result of being the next conductive TSV in the row with TSV 406, but conductive TSV 420 does not have closely associated dielectric TSVs. In a particular embodiment, conductive TSVs 414, 420 are associated with low-frequency, bias, or ground pins of ICs mounted on the interposer, and conductive TSVs 404, 406 are associated with high-frequency or high data rate pins.

Figure 5A:
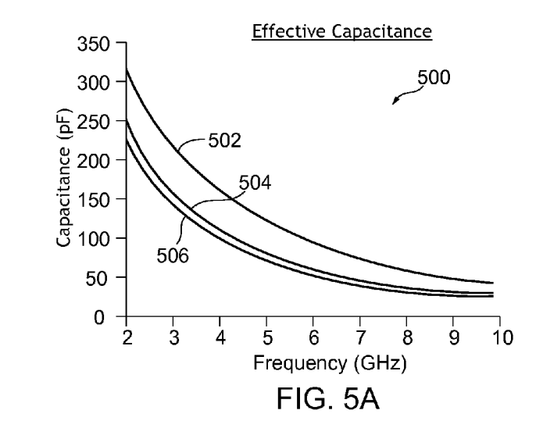
FIG. 5A is a chart showing simulated plots of effective capacitance versus frequency for a conventional conductive TSV and TSVs according to embodiments for a first wafer type.

FIG. 5A is a chart 500 showing simulated plots 502, 504, 506 of effective capacitance versus frequency for a conventional conductive TSV (plot 502); a conventional TSV surrounded by large air TSVs generally in accordance with FIG. 2 (plot 504); and a conventional TSV surrounded by small air TSVs generally in accordance with FIG. 4 (plot 506). These plots were simulated using an 0.5 micron thickness of silicon dioxide for the liner layer in the conductive TSVs and for a silicon wafer having a conductivity of 100 Siemens/meter (S/m) (1 ohm-cm resistivity). These plots show a substantial reduction in effective capacitance for conductive TSVs used in cooperation with dielectric TSVs according to the described embodiments.

Figure 5B:
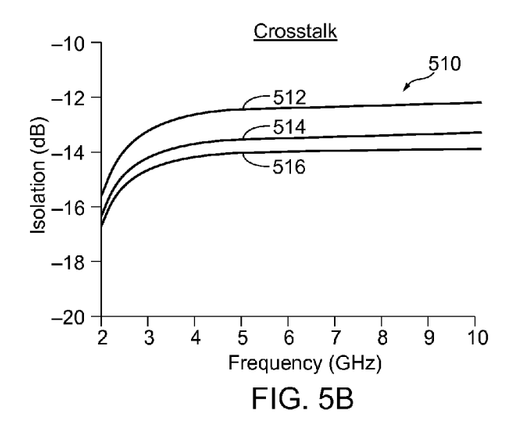
FIG. 5B is a chart showing simulated plots of isolation between conductive TSVs versus frequency for a conventional conductive TSVs according to embodiments for the first wafer type.

FIG. 5B is a chart 510 showing simulated plots 512, 514, 516 of isolation (crosstalk) between conductive TSVs versus frequency for a conventional conductive TSV (plot 512); a conventional TSV surrounded by large air TSVs generally in accordance with FIG. 2 (plot 514); and a conventional TSV surrounded by small air TSVs generally in accordance with FIG. 4 (plot 516). These plots were simulated using an 0.5 micron thickness of silicon dioxide for the liner layer in the conductive TSVs and for a silicon wafer having a conductivity of 100 S/m. These plots show a substantial reduction in crosstalk for conductive TSVs used in cooperation with dielectric TSVs according to the described embodiments.

Figure 6A:
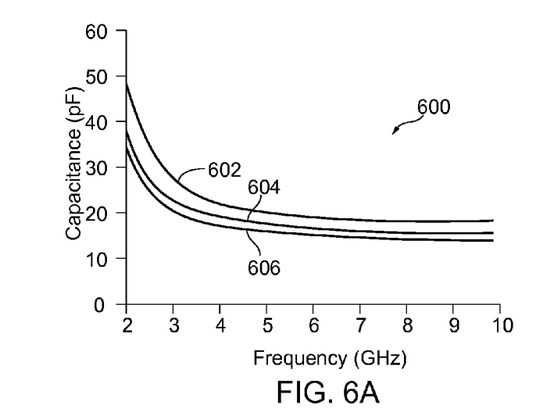
FIG. 6A is a chart showing simulated plots of effective capacitance versus frequency for a conventional conductive TSV and TSVs according to embodiments for a second wafer type.

FIG. 6A is a chart 600 showing simulated plots 602, 604, 606 of effective capacitance versus frequency for a conventional conductive TSV (plot 602); a conventional TSV surrounded by large air TSVs generally in accordance with FIG. 2 (plot 604); and a conventional TSV surrounded by small air TSVs generally in accordance with FIG. 4 (plot 606). These plots were simulated using a 2.4 micron thickness of silicon dioxide for the liner layer in the conductive TSVs and for a silicon wafer having a conductivity of 5 S/m (20 ohm-cm resistivity). These plots show a substantial reduction in effective capacitance for conductive TSVs used in cooperation with dielectric TSVs according to the described embodiments. They also demonstrate that an effective capacitance of less than 40 femto-Farads is achievable.

Figure 6B:
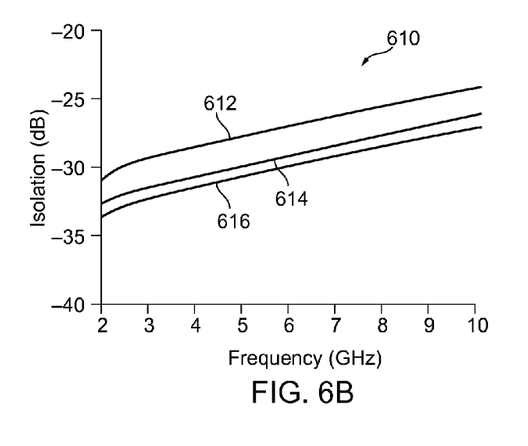
FIG. 6B is a chart showing simulated plots of isolation between conductive TSVs versus frequency for a conventional conductive TSVs according to embodiments for the second wafer type.

FIG. 6B is a chart 610 showing simulated plots 612, 614, 616 of isolation (crosstalk) between conductive TSVs versus frequency for a conventional conductive TSV (plot 612); a conventional TSV surrounded by large air TSVs generally in accordance with FIG. 2 (plot 614); and a conventional TSV surrounded by small air TSVs generally in accordance with FIG. 4 (plot 616). These plots were simulated using a 2.4 micron thickness of silicon dioxide for the liner layer in the conductive TSVs and for a silicon wafer having a conductivity of 5 Siemens/meter (S/m) (20 ohm-cm resistivity). These plots show a substantial reduction in crosstalk for conductive TSVs used in cooperation with dielectric TSVs according to the described embodiments. They also demonstrate that better than −30 dB of coupling can be achieved up to 6 GHz.

Conventional approaches to reducing crosstalk (improving isolation) and reducing capacitance include increasing the thickness of the thermal silicon dioxide liner layer of the conductive TSVs, and increasing the resistivity of the silicon substrate. Typical conductivities of silicon substrates range from about 5 S/m to about 100 S/m. A typical conductive liner layer of silicon dioxide is grown to a thickness of about 0.5 microns. Thicker liner layers take longer to grow, and have an upper limit of about 2.5 microns in thickness in typical fabrication processes.

Thus, plots 502 and 512 in FIGS. 5A and 5B represent the effective capacitance of a conductive via in silicon of relatively high conductivity and a relatively thin liner layer of 0.5 micron silicon dioxide (essentially worst case conditions), and plots 602 and 612 in FIGS. 6A and 6B represent the effective capacitance of a conductive via in silicon of relatively low conductivity and a relatively thick liner layer of silicon dioxide (essentially best case conditions). FIGS. 5A, 5B, 6A, and 6B show that dielectric TSVs according to the described embodiments significantly improve the electrical performance of associated conductive TSVs in both best- and worst-case conditions.

Figure 7:
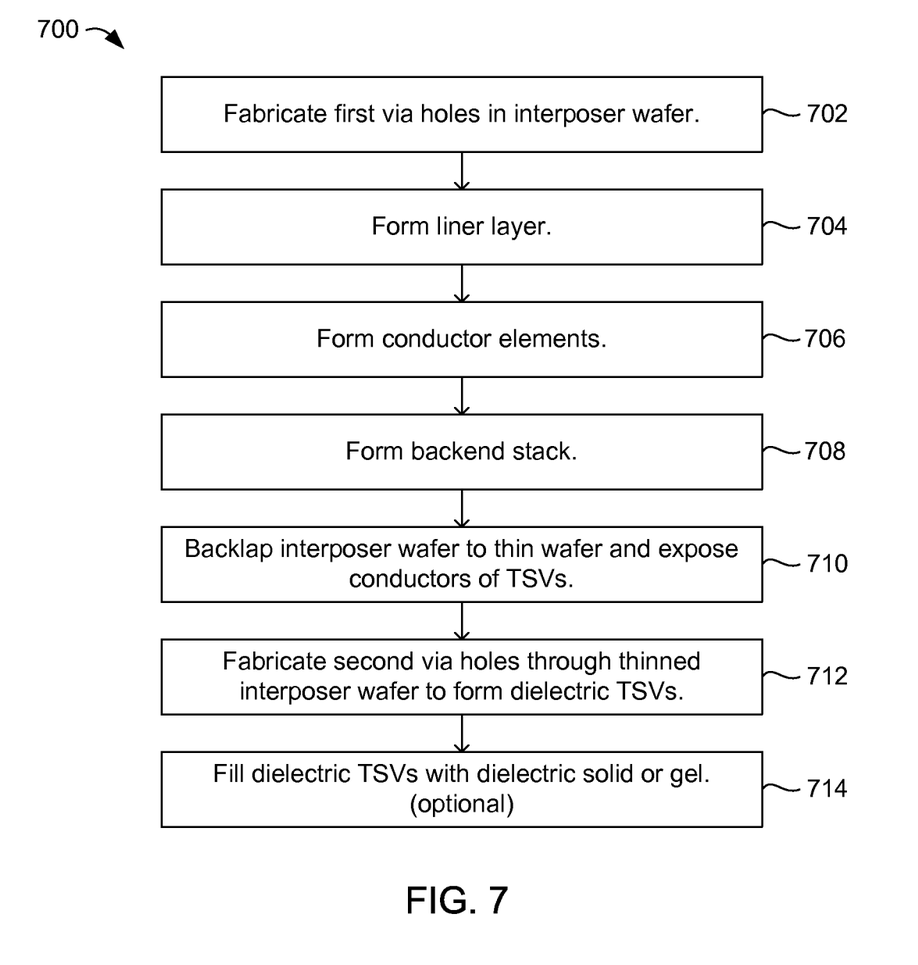
FIG. 7 is a flow chart of a process of fabricating an interposer according to an embodiment.

FIG. 7 is a flow chart of a process 700 of fabricating an interposer according to an embodiment. First, via holes are fabricated in a silicon interposer wafer (step 702) by etching from a first side (top side) partially through the silicon interposer wafer (i.e., to form blind holes). Photolithographic and anisotropic silicon etch techniques are used to form the via holes, as are well known in the art of TSV fabrication. A liner layer is formed on the interior sidewalls of the first via holes (step 704), and conductor elements are formed in the lined first via holes (step 706). In a particular embodiment, a thermal oxidation process is used to grow silicon oxide on the exposed silicon surfaces of the interposer wafer, such as the sidewalls of the via holes.

A backend stack of patterned metal layers and inter-metal dielectric layers is formed on a first side of the silicon interposer wafer (step 708). In a particular embodiment, the backend stack electrically connects the conductor elements in the lined first via holes to contact pads on the top of the backend stack. In a more particular embodiment, the contact pads form a contact array for mounting an IC to the interposer.

A second side (back side) of the silicon interposer wafer is lapped or otherwise removed (step 710) to thin the silicon interposer wafer to a desired thickness, and to expose the opposite ends (i.e., opposite the ends connected to the backend stack) of the conductive TSVs. This processing is commonly done by temporarily mounting the silicon interposer wafer on a handle wafer or other substrate with heat-sensitive temporary adhesive (e.g., wax) or other temporary adhesive, which makes the thinned wafer easier to handle and reduces breakage of the thinned wafer(s). Second via holes are fabricated from the second side of the thinned silicon interposer wafer so as to form dielectric TSVs (step 712), which generally extend from the backside of the interposer wafer to the backend stack (i.e., through the silicon wafer), but are alternatively blind holes that do not extend all the way through the silicon wafer. In a particular embodiment, the first dielectric layer of the backend stack serves as an etch-stop layer, or an etch-stop layer is provided under the backend stack. In some embodiments, an etch indicator layer is provided on the opposite side of the silicon (under the backend stack), and the etch process stops when etch products of the etch indicator layer are detected.

In a particular embodiment, a dielectric TSV is disposed between a first conductive TSV and a second conductive TSV. In a further embodiment, crosstalk between the first conductive TSV and the second conductive TSV is less than −30 dB at 6 GHz. In a further embodiment, the dielectric TSVs are optionally filled with a solid, liquid, or gel dielectric material (step 714). In a particular embodiment, the dielectric TSVs are filled with dielectric material in a liquid form, which is then hardened or cured to form a solid or gel dielectric material.

Figure 8:
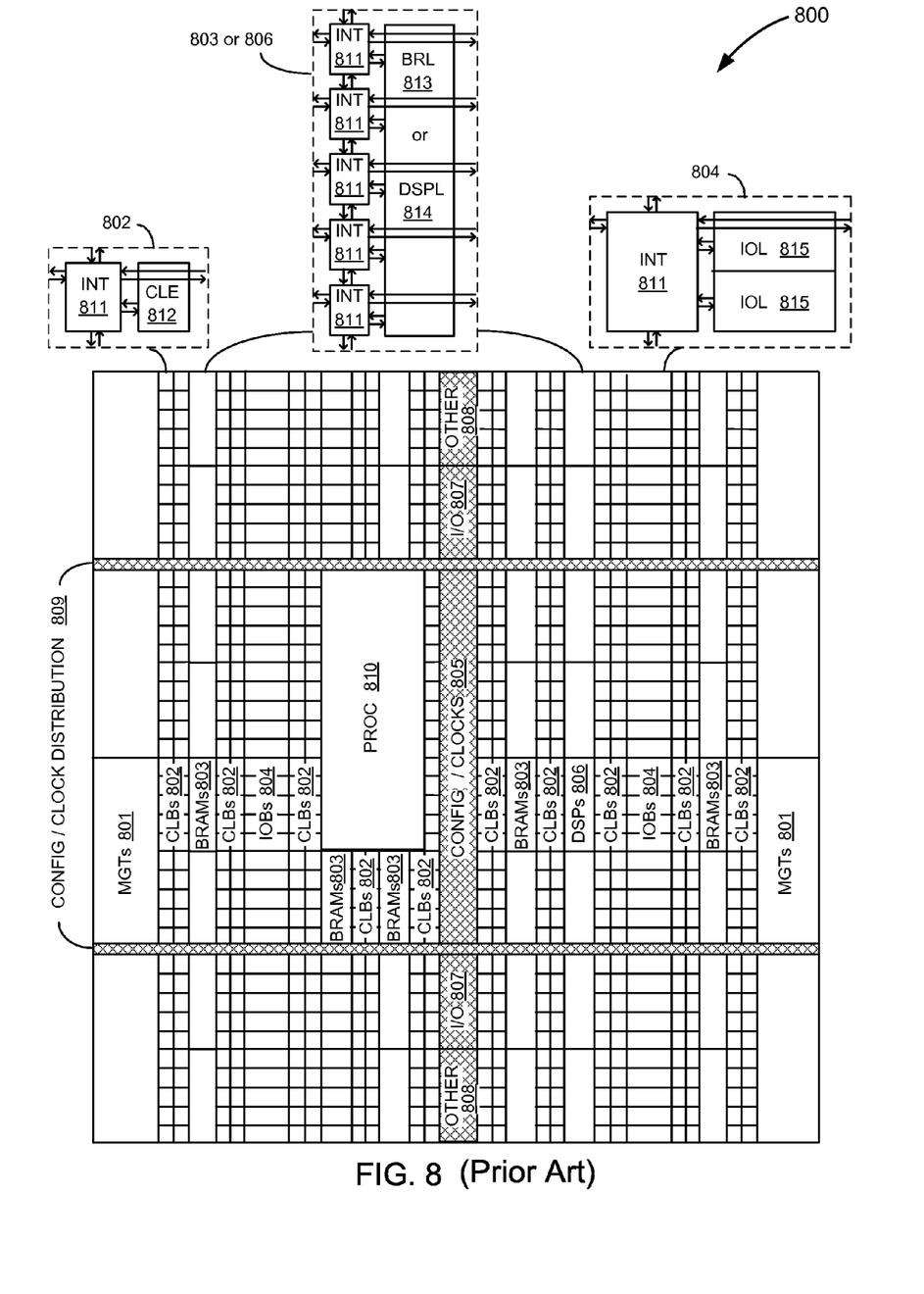
FIG. 8 is a plan view of a field programmable gate array (FPGA) suitable for use with the described embodiments.

FIG. 8 is a plan view of an FPGA 800 suitable for use with the embodiments described herein. For example, one or more of the ICs 104, 106, 108, 110 in FIG. 1 can be an FPGA in accordance with FIG. 8. The FPGA can be fabricated using a CMOS fabrication process or a mixed CMOS/NMOS process, for example.

The illustrated FPGA architecture includes a large number of different programmable tiles including multi-gigabit transceivers (MGTs) 801, configurable logic blocks (CLBs) 802, random access memory blocks (BRAMs) 803, input/output blocks (IOBs) 804, configuration and clocking logic (CONFIG/CLOCKS) 805, digital signal processing (DSP) blocks 806, specialized input/output blocks (I/O) 807 (e.g., configuration ports and clock ports), and other programmable logic 808 such as digital clock managers, analog-to-digital converters, system monitoring logic, and so forth. Some FPGAs also include dedicated processor blocks (PROC) 810. Horizontal areas 809 extending from the CONFIG/CLOCKS 805 column are used to distribute the clocks and configuration signals across the breadth of the FPGA 800.

In some FPGAs, each programmable tile includes a programmable interconnect element (INT) 811 having standardized connections to and from a corresponding interconnect element in each adjacent tile. Therefore, the programmable interconnect elements taken together implement the programmable interconnect structure for the illustrated FPGA. The programmable interconnect element (INT) 811 also includes the connections to and from the programmable logic element within the same tile, as shown by the examples included at the top of FIG. 8.

For example, a CLB 802 can include a configurable logic element (CLE 812) that can be programmed to implement user logic plus a single programmable interconnect element (INT) 811. A BRAM 803 can include a BRAM logic element (BRL) 813 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 806 can include a DSP logic element (DSPL) 814 in addition to an appropriate number of programmable interconnect elements. An IOB 804 can include, for example, two instances of an input/output logic element (IOL) 815 in addition to one instance of the programmable interconnect element (INT) 811. Some FPGAs utilizing the architecture illustrated in FIG. 8 include additional logic blocks that disrupt the regular columnar structure making up a large part of the FPGA. The additional logic blocks can be programmable blocks and/or dedicated logic. For example, the processor block PROC 810 shown in FIG. 8 spans several columns of CLBs and BRAMs. PROC 810 may comprise a single power domain or it may comprise multiple power domains or it may share a power domain with other blocks in FPGA 800.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art in view of the disclosure herein. For example, alternative arrangements of dielectric TSVs, or different types of substrates or substrate material could be used, or processing steps could be performed in a different order. Therefore, the spirit and scope of the appended claims should not be limited to the foregoing description.

What is claimed is:

1. A device, comprising:
a silicon substrate having a first surface and a second surface;
a plurality of patterned metal layers and intervening dielectric layers fabricated on the first surface of the silicon substrate;
a first conductive via extending from the first surface of the silicon substrate through the silicon substrate to the second surface of the silicon substrate;
a dielectric via extending from the second surface of the silicon substrate toward the first surface of the silicon substrate; and
a second conductive via extending from the first surface of the silicon substrate to the second surface of the silicon substrate;
wherein the dielectric via is fully disposed between the first conductive via and the second conductive via, and is spaced away from the first conductive via and the second conductive via.

2. The device of claim 1, wherein the dielectric via extends from the second surface of the silicon substrate through the silicon substrate to the first surface of the silicon substrate.

3. The device of claim 1, wherein the dielectric via is an air via.

4. The device of claim 1, wherein:
the plurality of patterned metal layers includes a patterned metal layer defining a contact array; and
the device further comprises an integrated circuit flip-chip bonded to the contact array.

5. The device of claim 4, wherein:
the integrated circuit comprises a field-programmable gate array; and
the device further comprises a second integrated circuit flip-chip bonded to a second contact array.

6. The device of claim 1, wherein the silicon substrate comprises an integrated circuit substrate.

7. The device of claim 1, further comprising:
a third conductive via, the dielectric via being disposed between the first conductive via and the third conductive via; and
a second dielectric via, the second dielectric via being disposed between the first dielectric via and the third conductive via.

8. The device of claim 1, wherein:
the dielectric via is proximate to the first conductive via; and the device further comprises
- a second dielectric via proximate to the first conductive via,
- a third dielectric via proximate to the first conductive via,
- a fourth dielectric via proximate to the first conductive via,
- a fifth dielectric via diagonally proximate to the first conductive via,
- a sixth dielectric via diagonally proximate to the first conductive via,
- a seventh dielectric via diagonally proximate to the first conductive via, and
- an eighth dielectric via diagonally proximate to the first conductive via.

9. The device of claim 1, wherein:
the dielectric via is proximate to the first conductive via at a distance from the first conductive via; and the device further comprises a second dielectric via disposed at the distance from the first conductive via, a third dielectric via disposed at the distance from the first conductive via, and a fourth dielectric via disposed at the distance from the first conductive via.

10. The device of claim 1, further comprising a solder ball connected to the first conductive via at the second surface of the silicon substrate.

11. The device of claim 1, wherein the dielectric via has a cross section that is essentially round.

12. A device, comprising:
a silicon substrate having a first surface and a second surface;

a first conductive via extending from the first surface of the silicon substrate through the silicon substrate to the second surface of the silicon substrate;

a dielectric via extending from the second surface of the silicon substrate toward the first surface of the silicon substrate; and a second conductive via extending from the first surface of the silicon substrate to the second surface of the silicon substrate;

wherein:
the dielectric via is fully disposed between the first conductive via and the second conductive via, and is spaced away from the first conductive via and the second conductive via;

the first conductive via includes a conductive element having a first diameter; and the dielectric via has a second diameter, the second diameter being greater than the first diameter.

13. A device, comprising:
a silicon substrate having a first surface and a second surface;

a first conductive via extending from the first surface of the silicon substrate through the silicon substrate to the second surface of the silicon substrate;

a dielectric via extending from the second surface of the silicon substrate toward the first surface of the silicon substrate; and a second conductive via extending from the first surface of the silicon substrate to the second surface of the silicon substrate;

wherein:
the dielectric via is fully disposed between the first conductive via and the second conductive via, and is spaced away from the first conductive via and the second conductive via;

the first conductive via includes a conductive element having a first diameter; and the dielectric via has a second diameter, the second diameter being less than the first diameter.

* * * * *